(12) United States Patent
Kumar et al.

(10) Patent No.: US 11,270,040 B2
(45) Date of Patent: Mar. 8, 2022

(54) SIMULATION SYSTEM FOR A PRODUCTION ENVIRONMENT AND RELATED METHODS OF USE

(71) Applicant: Walmart Apollo, LLC, Bentonville, AR (US)

(72) Inventors: Sindiri Sai Kumar, Bengaluru (IN); Sandip Mahanta, Bengaluru (IN); Puneet Kala, Bengaluru (IN); Rishi Saraf, Bangalore (IN); Tanvi Gupta, Delhi (IN); Nyshadam Nagamallika, Mysore (IN); Shantanu Preetam, Bengaluru (IN)

(73) Assignee: Walmart Apollo, LLC, Bentonville, AR (US)

( * ) Notice: Subject to any disclaimer, the term of this patent is extended or adjusted under 35 U.S.C. 154(b) by 909 days.

(21) Appl. No.: 16/011,198

(22) Filed: Jun. 18, 2018

(65) Prior Publication Data

US 2019/0286764 A1    Sep. 19, 2019

(30) Foreign Application Priority Data

Mar. 16, 2018  (IN) .............................. 201811009628

(51) Int. Cl.
*G06F 30/20*  (2020.01)
*G06Q 10/08*  (2012.01)
(Continued)

(52) U.S. Cl.
CPC .............. *G06F 30/20* (2020.01); *G06F 8/316* (2013.01); *G06Q 10/06393* (2013.01); *G06Q 10/087* (2013.01)

(58) Field of Classification Search
CPC ... G06F 30/20; G06F 8/316; G06Q 10/06393; G06Q 10/087
See application file for complete search history.

(56) References Cited

U.S. PATENT DOCUMENTS

| | | | |
|---|---|---|---|
| 8,000,988 B1 * | 8/2011 | Bezanson | G06Q 10/08 705/7.11 |
| 8,498,889 B1 | 7/2013 | Marsten | |

(Continued)

OTHER PUBLICATIONS

Cheng, L., Didi, X., Mingyong, L., & Yan, W. (Sep. 2006). Design and implement of warehouse management system based on AOP. In 2006 IEEE International Engineering Management Conference (pp. 243-246). IEEE. (Year: 2006).*

(Continued)

*Primary Examiner* — Bijan Mapar
(74) *Attorney, Agent, or Firm* — Fitch, Even, Tabin & Flannery LLP (57) ABSTRACT

Described in detail herein are simulation systems for a production environment and related methods of use. In one exemplary system a routing application receives a request associated with one or more physical objects. Based on the request, the routing application retrieves one or more simulation profiles from a database and forwards the request and the simulation profiles to a first computing system. The first computing system hosts a simulation environment and simultaneously executes a simulation of the request for each simulation profile in the simulation environment. The first computing system generates resultant data in response to executing each simulation that may be used to alter a production application for a production environment.

20 Claims, 6 Drawing Sheets

(51) Int. Cl.
*G06Q 10/06* (2012.01)
*G06F 8/30* (2018.01)

(56) References Cited

U.S. PATENT DOCUMENTS

| | | | |
|---|---|---|---|
| 9,842,308 B1 * | 12/2017 | Biswas | G06Q 10/083 |
| 2005/0288986 A1 | 12/2005 | Barts et al. | |
| 2007/0143131 A1 | 6/2007 | Kasper et al. | |
| 2009/0063221 A1 | 3/2009 | Jonath et al. | |
| 2012/0054076 A1 | 3/2012 | Wu et al. | |
| 2017/0323250 A1 * | 11/2017 | Lindbo | G06Q 10/08345 |

OTHER PUBLICATIONS

Settanni et al., Pharmaceutical supply chain models: A synthesis from a systems view of operations research. Operations Research Perspectives. 2014;4:74-95.

International Search Report and Written Opinion for Application No. PCT/US2019/022570, dated May 28, 2019, 11 pages.

International Preliminary Report on Patentability for Application No. PCT/US2019/022570, dated Oct. 1, 2020, 6 pages.

* cited by examiner

SIMULATION SYSTEM FOR A PRODUCTION ENVIRONMENT AND RELATED METHODS OF USE

CROSS-REFERENCE TO RELATED PATENT APPLICATION

This application claims priority to Indian Patent Application No. 201811009628 filed on Mar. 16, 2018, the contents of which are hereby incorporated by reference in its entirety.

BACKGROUND

Order fulfillment for ecommerce orders is a function of network operational constraints such as inventory availability at fulfillment centers (FCs), FC center capacity and calendars, carrier capacity and calendars and capacity overrides or levers set into the system to influence the flow of orders in the network.

BRIEF DESCRIPTION OF DRAWINGS

Illustrative embodiments are shown by way of example in the accompanying drawings and should not be considered as a limitation of the present disclosure. The accompanying figures, which are incorporated in and constitute a part of this specification, illustrate one or more embodiments of the disclosure and, together with the description, help to explain the inventive aspects of the present disclosure. In the figures.

DETAILED DESCRIPTION

Described in detail herein are simulation systems for a production environment and methods of using the same. In an exemplary system, a routing application receives a request associated with one or more physical objects. The routing application retrieves one or more simulation profiles from a database and forwards the request and the one or more simulation profiles to a first computing system. The first computing system hosts a simulation environment and simultaneously executes a simulation of the request for each simulation profile in the simulation environment. The first computing system generates resultant data in response to executing each simulation that may be forwarded and used to alter a production environment.

In one embodiment, a simulation system for a production environment includes a first computing system hosting a simulation environment in communication with a first database. The system further includes a second computing system hosting a production application. The system further includes a routing application in communication with the first database and the first computing system. The routing application when executed is configured to receive a request associated with one or more physical objects, and retrieve from the first database one or more simulation profiles associated with the one or more physical objects. The simulation profiles each include a set of rules applicable to simulating the request. The routing application is further configured to forward the request and the one or more simulation profiles to the first computing system. The first computing system is configured to receive the request and the one or more simulation profiles, simultaneously execute a simulation of the request for each simulation profile of the one or more simulation profiles in the simulation environment, and generate resultant simulation data in response to executing each simulation. The second computing system is configured to perform the request with the production application. The performance of the request generates resultant production data. The resultant simulation data and the resultant production data are evaluated with respect to key performance indicators. Following the evaluating, the production application is altered based on the resultant simulation data.

In one embodiment, a method of simulation for a production environment includes receiving, via a routing application in communication with a first database and a first computing system, a request associated with one or more physical object, retrieving, via the routing application, from the first database one or more simulation profiles associated with the one or more physical objects. The simulation profiles each include a set of rules applicable to simulating the request. The method further includes forwarding, via the routing application, the request and the one or more simulation profiles to the first computing system. The method further includes receiving, via the first computing system hosting a simulation environment and in communication with the first database, the request and the one or more simulation profiles, simultaneously executing, via the first computing system, a simulation of the request for each simulation profile of the one or more simulation profiles in the simulation environment, and generating, via the first computing system, resultant simulation data in response to executing each simulation. The method further includes performing, via a second computing system hosting a production environment, the request with the production application, the performance of the request generating resultant production data. The resultant simulation data and the resultant production data are evaluated with respect to key performance indicators, and following the evaluating, the production application is altered based on the resultant simulation data.

In one embodiment, a non-transitory computer readable memory medium storing instructions for executing simulations for a production environment and the instructions are executable by a processor to receive, via a routing application in communication with a first database and a first computing system, a request associated with one or more physical object, and retrieve, via the routing application, from the first database one or more simulation profiles associated with the one or more physical objects. The simulation profiles each include a set of rules applicable to simulating the request. The instructions are further executable by a processor to forward, via the routing application, the request and the one or more simulation profiles to the first computing system. The instructions are further executable by a processor to receive, via the first computing system hosting a simulation environment and in communication with the first database, the request and the one or more simulation profiles, simultaneously execute, via the first computing system, a simulation of the request for each simulation profile of the one or more simulation profiles in the simulation environment and generate, via the first computing system, resultant simulation data in response to executing each simulation. The instructions are further executable by a processor to perform, via a second computing system hosting a production environment, the request with the production application, the performance of the request generating resultant production data. The resultant simulation data and the resultant production data are evaluated with respect to key performance indicators, and following the evaluating, the production application is altered based on the resultant simulation data.

Figure 1:
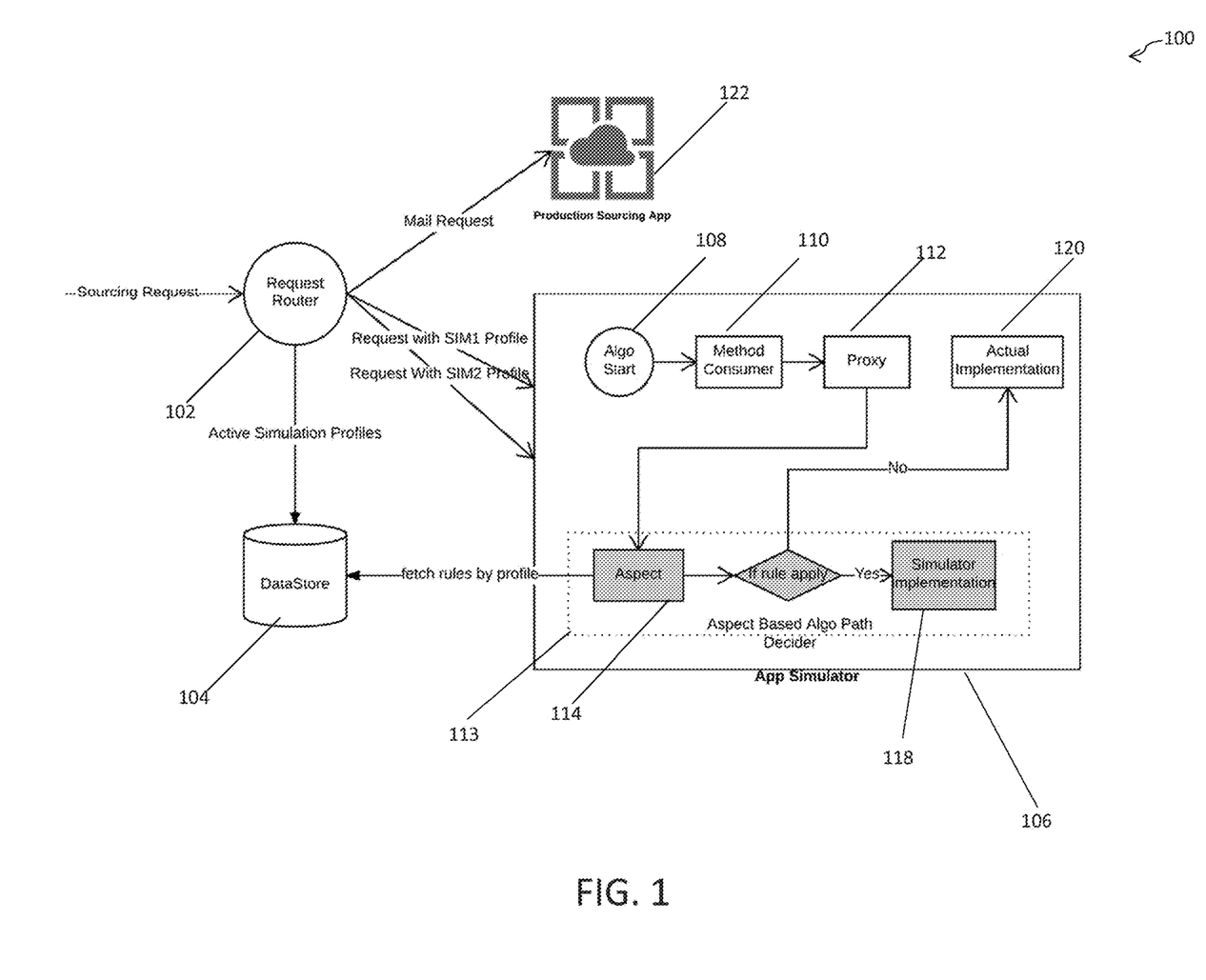
FIG. 1 is a block diagram of a simulator in a simulation environment in accordance with an exemplary embodiment.

FIG. 1 is a block diagram of a simulator in a simulation system in accordance with an exemplary embodiment. In an exemplary embodiment, a simulation system 100 can include a request routing application 102, a profiles database 104, and a simulator 106. The simulator 106 can include an algorithm start module 108, a method consumer module 110, a proxy module 112, a decider module 113 that includes an aspect module 114 and a simulator implementation module 118 and an actual implementation module 120. The simulation system 100 can also communicate with a production sourcing application 122. The simulation system 100 can be implemented to determine an optimal delivery method of physical objects based on travel time, cost, estimated delivery time, taxes and/or other constraints and parameters.

The request routing application 102 can receive a request associated with the delivery of physical objects. The request routing application 102 can query the profiles database 104 to retrieve simulation profiles associated with the set of physical objects. Each of the simulation profiles includes a set of rules applicable to simulating the request. Each simulation profile can be used to execute simulations of the request (i.e. a simulation of the delivery of physical objects) to determine optimal parameters for delivering physical objects based on a specified set of rules. The simulation profiles can be retrieved based on location from which the request was transmitted, the type of physical objects, the delivery location of the physical objects or the quantity of physical objects. The request routing application 102 can transmit the request and the retrieved simulation profiles to the simulator 106. As an example, for each of the retrieved simulation profiles the request routing application 102 can make a sourcing http request that includes the simulation profile name in the header.

The simulator 106 can execute a simulation of the request for each simulation profile. For example, the algorithm start 108 module can forward the request to the method consumer module 110. The method consumer module 110 can extract the name of the simulation profile from the header of the sourcing http request. The method consumer module 110 can then forward the request and simulation profile name to the proxy module. The simulator 106 can verify whether the simulation profile is eligible for simulation through a Spring Proxy Class (i.e. the proxy module 112). The proxy module 112 can create a proxy for a specific target object. For example, the proxy module 112 can implement interfaces specified at runtime. The proxy module 112 can determine the simulation profile is eligible for simulation and in runtime call a Spring Aspect (i.e. the aspect module 114).

The aspect module 114 can retrieve rules for executing the simulation of the request, associated with the simulation profile, from the profiles database 104. The aspect module 114 can verify whether each of the retrieved rules can be applied in the simulation of the request, based on the location from which the request was transmitted, the type of physical objects, the delivery location of the physical objects or the quantity of physical objects. In response to determining that a rule can apply to the simulation of the request, the aspect module forwards the request along with the verified rule of the simulation profile to the simulation implementation module 118. The simulation implementation module 118 can execute the simulation of the request based on the verified rule of the simulation profile. In response to determining the rule cannot be applied to the simulation of the request, the aspect module forwards the request to the actual implementation module 122. The actual implementation module 122 can execute the simulation of the request without implementing the unverified rule.

In response to executing a simulation for the request for each simulation profile, the simulator 106 can determine an optimal delivery method of the physical objects based on at least one of the simulation profiles. In one embodiment, the simulator 106 can determine that a parameter (i.e. cost, estimated delivery time, tax and/or other factors) of the optimal delivery method is below a specified threshold. In response to determining that a parameter of the optimal delivery method is below the specified threshold the simulator 106 can automatically transmit the request to the production sourcing application 122 to implement optimal delivery method in a production environment. The production environment can be a distributed computing system which can generate the instructions for delivery of the physical object.

Figure 2:
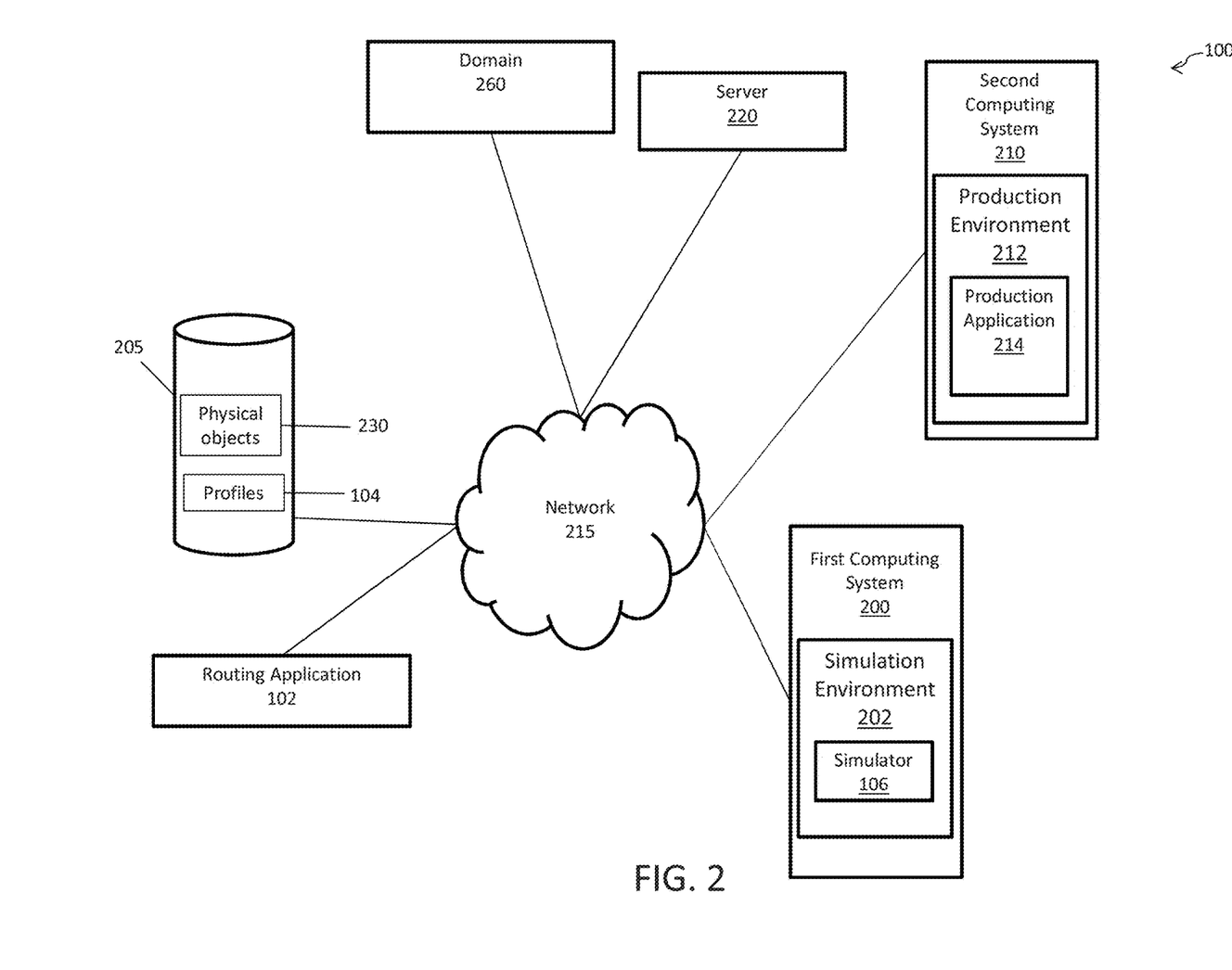
FIG. 2 illustrates a network diagram of a simulation system in accordance with an exemplary embodiment.

FIG. 2 illustrates a network diagram of simulation system 100 in accordance with an exemplary embodiment. The simulation system 100 can include one or more databases 205, one or more first computing systems 200, one or more second computing systems 210, one or more domains 260, and one or more routing applications 102, communicating over communication network 215. The first computing system 200 can include a simulation environment 202 hosting a simulator 106 and can be in communication with the second computing systems 210, the databases 205 domains 260 and the routing applications 102, via communication network 215. The simulator 106 can be an executable application to implement the simulation system 100 as described herein. The second computing system 210 can include a production environment 212 hosting a production application 214. The production application 214 can be an executable application.

In an example embodiment, one or more portions of the communications network 215 can be an ad hoc network, an intranet, an extranet, a virtual private network (VPN), a local area network (LAN), a wireless LAN (WLAN), a wide area network (WAN), a wireless wide area network (WWAN), a metropolitan area network (MAN), a portion of the Internet, a portion of the Public Switched Telephone Network (PSTN), a cellular telephone network, a wireless network, a WiFi network, a WiMax network, any other type of network, or a combination of two or more such networks.

The first computing system 200 includes one or more computers or processors configured to communicate with the databases 105, the second computing systems 210, the domains 260 and the routing applications 102, via the network 315. The first computing system 200 hosts one or more applications configured to interact with one or more components of the simulation system 100. The databases 205 may store information/data, as described herein. For example, the databases 205 can include a physical objects database 230 and a profiles database 104. The physical objects database 230 can store information associated with physical objects. The profiles database 104 can include simulation profiles and rules associated with the simulation profiles. The databases 205 can be located at one or more geographically distributed locations from the first computing system 200. Alternatively, the databases 205 can be included within the first computing system 200.

In one embodiment, the request routing application 102 can receive a request associated with the delivery of physical objects. As an example, the request routing application 102 can receive a request from a domain 260. The domain 260 can be a web-based domain associated with a facility. The request routing application 102 can query the profiles database 104 to retrieve simulation profiles associated with the set of physical objects. A simulation profile can be a set of rules which need to be applied for a simulation call. The request routing application 102 can transmit the request and the retrieved simulation profiles to the first computing system 200.

The simulator 106 can query the physical objects database 230 to retrieve information associated with the physical objects to be delivered. The simulator 106 can verify whether the simulation profile is eligible for simulation through a Spring Proxy Class. The simulator 106 can retrieve rules for executing the simulation of the request, associated with the simulation profile, from the profiles database 104. A rule can be an alternative implementation for a given method or class or feature. As an example, the rule can assume a certain quantity of physical objects and/or a specified delivery route. The simulator 106 can verify whether each of the retrieved rules can be applied in the simulation of the request, based on the request and the information associated with the physical objects to be delivered. For example, the simulator 106 can verify whether each of the rules can be applied based on a location from which the request was transmitted, the type of physical objects, the delivery location of the physical objects or the quantity of physical objects. In response to determining that a rule can apply to the simulation of the request, simulator 106 can bypass a portion of the simulation based on the verified rule and execute the simulation of the request. In response to determining that the rule cannot be applied to the simulation of the request, the simulator 106 can execute the simulation of the request without implementing the unverified rule.

In response to executing a simulation for the request for each simulation profile, the simulator 106 can determine an optimal delivery method of the physical objects based on at least one of the simulation profiles. In one embodiment, the simulator 106 can determine that a parameter (i.e. cost, estimated delivery time, tax and/or other factors) of the optimal delivery method is below a specified threshold. In response to determining that a parameter of the optimal delivery method is below the threshold, the simulator 106 can automatically transmit the request to the second computing system 210. As described above, the second computing system 210 can host a production environment. The production environment can include a production sourcing application 122. In response to receiving the request from simulator 106, the production sourcing application 122 can implement an optimal delivery method in a production environment.

As a non-limiting example, the simulation system 100 can be implemented in a retail store/e-commerce environment. The request routing application 102 can receive a request associated with the delivery of items purchased at a retail store and/or e-commerce website. The routing application 102 can receive the request from a domain 260. The domain 260 can be associated with an e-commerce website and/or Point-of-Sale Controller at a retail store. The request routing application 102 can query the profiles database 104 to retrieve simulation profiles associated with the set of physical objects. The request routing application 102 can transmit the request and the retrieved simulation profiles to the first computing system 200.

The simulator 106 can query the physical objects database 230 to retrieve information associated with the purchased items to be delivered. Each simulation profile can be configured to provide a different route, procedure and/or method of delivery of the purchased items, based on location from which the request was transmitted, the type of item, the delivery location of the item or the quantity of items. The simulator 106 can simulate the delivery of the purchased items based on the simulation profile and the information associated with the purchased items to be delivered.

The simulator 106 can retrieve rules for executing the simulation of the request, associated with the simulation profile, from the profiles database 104. The rules can be associated with various information about the request and/or the purchased items to be delivered. For example, the simulation can instruct the simulator to assume the inventory of a specified item, tax costs, and/or transportation costs (i.e. gasoline costs, airfare costs, ground transportation costs and other costs associated with transportation). The simulator 106 can verify whether each of the retrieved rules can be applied in the simulation of the request, based on the location from which the request was transmitted, the type of physical objects, the delivery location of the physical objects or the quantity of physical objects.

For example, the simulation profile can be associated with a rule which assumes an inventory amount of a specified purchased item. The simulator 106 can verify that the rule can apply to the simulation. In response to determining that a rule can apply to the simulation of the request, simulator 106 can execute the simulation of the request and can bypass a portion of the simulation based on the verified rule. For example, the simulator 106 can bypass querying the inventory of a purchased item as the simulator is instructed to assume the inventory amount of a specified purchased item.

In another example, the simulation profile can be associated with a rule which assumes a specified ground transportation cost. The simulator 106 can determine that the delivery of the purchased items requires air transportation and ground transportation is not needed. Accordingly, the simulator 106 can determine that the rule which assumes a specified ground transportation cost does not apply. In response to determining the rule cannot be applied to the simulation of the request, the simulator 106 can execute the simulation of the request without implementing the unverified rule.

In response to executing a simulation for the request for each simulation profile, the simulator 106 can determine an optimal delivery method of the items based on at least one of the simulation profiles. In one embodiment, the simulator 106 can determine that a parameter (i.e. cost, estimated delivery time, tax and/or other factors) of the optimal delivery method is below a specified threshold. For example, the simulator 106 can determine that the cost of a particular delivery method is below a threshold amount, based on resultant data generated by executing a simulation of the request based on a particular simulation profile. In response to determining that a parameter of the optimal delivery method is below a specified threshold, the simulator 106 can automatically transmit the request to the second computing system 210. As described above, the second computing system 210 can host a production environment. The production environment can include a production sourcing application 122. In response to receiving the request from simulator 106, the production sourcing application 122 can implement the optimal delivery method in a production environment. For example, the production sourcing application 122 can be associated with an order fulfillment system and the production sourcing application may generate instructions to fill an order using the optimal delivery method.

As a non-limiting example the following exemplary classes can be used in implementing the simulation system 100:

```
//Rule Class which define given rule with
alternate implementation detail
public enum Rule {
PRICE_WITHOUT_TAX("simulatorPriceCalculator",
"itemPriceWithouttax"),
}
// Actual Implementation
public class PriceCalculator implements CostCalculator {
    @RunSimulation(applicableRules =
    {Rule.PRICE_WITHOUT_TAX})
    public double itemPrice(itemCost, transportatinCost, tax) {
        return itemCost + transportatinCost + tax;
    }
}
//Simulator Implementation
public class SimulatorPriceCalculator implements
CostCalculator {
    public double itemPriceWithouttax(itemCost,
    transportatinCost, tax) {
        return itemCost + transportatinCost ;
    }
}
//Caller which call itemPrice method
public class Caller  {
    public void method( ) {
    costCalculator.itemPrice(itemCost, transportatinCost, tax);
    }
}
```

Figure 3:
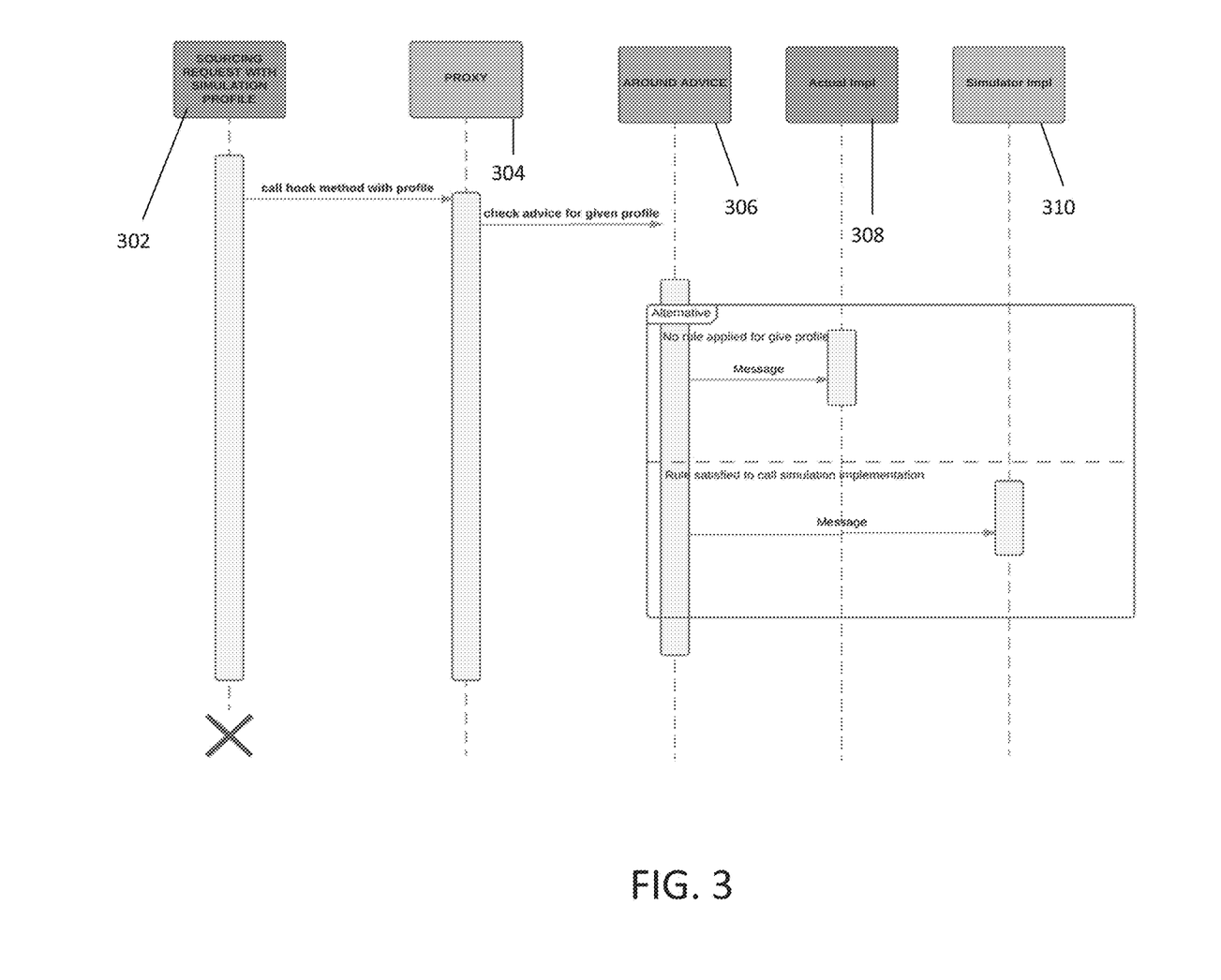
FIG. 3 is a block diagram illustrating the process of executing simulations using simulation profiles in accordance with an exemplary embodiment.

FIG. 3 is a block diagram illustrating a sequence diagram of the simulation system in accordance with an exemplary embodiment. In an exemplary embodiment, Spring Aspect Oriented Programming (Spring AOP) can be used to implement the simulation system. Aspects are the object of modularity in Spring AOP. Spring AOP can be implemented to break down logic into distinct parts, such as "concerns." The concerns can be separate from the business logic. As a non-limiting example, aspects can include one or more of, logging, auditing, declarative transactions, security, caching. Spring AOP can provide declarative enterprise services and allow users to implement custom aspects in Object Oriented Programming (OOP). Each method which needs to be implemented in the simulation can be annotated with "@RunSimulation" with a set rule that can be applied to the that particular method.

In the exemplary embodiment, the sourcing request with a simulation profile method 302 can call a hook method, the Proxy method 304. The Proxy method 304 can identify the request to be executed with the particular simulation profile based on the annotation. The Proxy method 304 can call an Around Advice method 306 to check for any rules associated with the particular simulation profile. The Around Advice method 306 can determine whether any rule should be applied to the simulation profile (based on the context in which the request was made). In response to determining that a rule should not be applied, the Around Advice method 306 can transmit a message to an Actual Implementation method 308 to execute the simulation as originally implemented. In response to determining that a rule should be applied, the Around Advice method 306 can transmit a message to the Simulator Implementation method 310 to execute the simulation based on the rule.

As a non-limiting example, simulation system 100 can measure the impact of handling cost. Handling cost is a network level cost setting that helps direct volume to fulfillment centers (e.g., a positive handling cost at a fulfillment center will deflect volume away from it while a negative handling cost routes traffic to the fulfillment center). As another example, the simulation system 100 can measure the impact of eliminating capacity constraints in the network. As another example, the simulation can measure the impact of eliminating item costs at each node (i.e., item costs can account for ~50% of the fulfillment cost). As another example, the simulation system 100 can measure the impact of evaluating a larger set of potential solutions to fulfill an order. As another example, measure the impact of a heuristic based algorithm to reduce the number of boxes shipped against a cost minimization algorithm.

Figure 4:
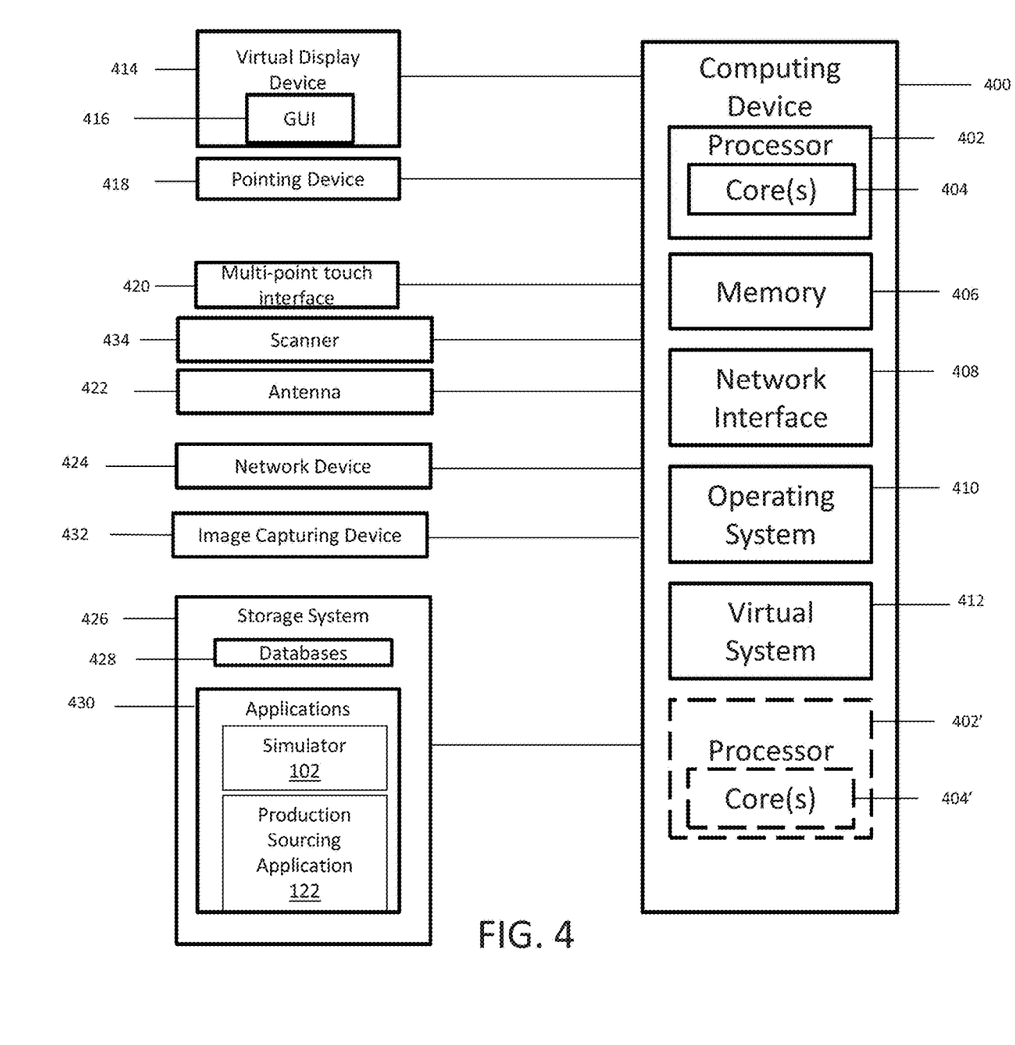
FIG. 4 illustrates a block diagram of an exemplary computing device in accordance with an exemplary embodiment.

FIG. 4 is a block diagram of an exemplary computing device suitable for implementing embodiments of the simulation system. The computing device may be, but is not limited to, a smartphone, laptop, tablet, desktop computer, server or network appliance. The computing device 400 can be embodied as part of the local computing system and/or terminal. The computing device 400 includes one or more non-transitory computer-readable media for storing one or more computer-executable instructions or software for implementing exemplary embodiments. The non-transitory computer-readable media may include, but are not limited to, one or more types of hardware memory, non-transitory tangible media (for example, one or more magnetic storage disks, one or more optical disks, one or more flash drives, one or more solid state disks), and the like. For example, memory 406 included in the computing device 400 may store computer-readable and computer-executable instructions or software (e.g., applications 430 such as the simulator 106 and the sourcing production application 122) for implementing exemplary operations of the computing device 400. The computing device 400 also includes configurable and/or programmable processor 402 and associated core(s) 404, and optionally, one or more additional configurable and/or programmable processor(s) 402' and associated core(s) 404' (for example, in the case of computer systems having multiple processors/cores), for executing computer-readable and computer-executable instructions or software stored in the memory 406 and other programs for implementing exemplary embodiments of the present disclosure. Processor 402 and processor(s) 402' may each be a single core processor or multiple core (404 and 404') processor. Either or both of processor 402 and processor(s) 402' may be configured to execute one or more of the instructions described in connection with computing device 400.

Virtualization may be employed in the computing device 400 so that infrastructure and resources in the computing device 400 may be shared dynamically. A virtual machine 412 may be provided to handle a process running on multiple processors so that the process appears to be using only one computing resource rather than multiple computing resources. Multiple virtual machines may also be used with one processor.

Memory 406 may include a computer system memory or random access memory, such as DRAM, SRAM, EDO RAM, and the like. Memory 406 may include other types of memory as well, or combinations thereof. The computing device 400 can receive data from input/output devices such as, a reader 334 and an image capturing device 432.

A user may interact with the computing device 400 through a visual display device 414, such as a computer monitor, which may display one or more graphical user interfaces 416, multi touch interface 420 and a pointing device 418.

The computing device 400 may also include one or more storage devices 426, such as a hard-drive, CD-ROM, or other computer readable media, for storing data and computer-readable instructions and/or software that implement exemplary embodiments of the present disclosure (e.g., applications 330 such as the simulator 106 and the sourcing production application 122). For example, exemplary storage device 426 can include one or more databases 428 for storing information regarding the physical objects and simulation profiles and the rules associated with the simulation profiles. The databases 428 may be updated manually or automatically at any suitable time to add, delete, and/or update one or more data items in the databases.

The computing device 400 can include a network interface 408 configured to interface via one or more network devices 424 with one or more networks, for example, Local Area Network (LAN), Wide Area Network (WAN) or the Internet through a variety of connections including, but not limited to, standard telephone lines, LAN or WAN links (for example, 802.11, T1, T3, 56 kb, X.25), broadband connections (for example, ISDN, Frame Relay, ATM), wireless connections, controller area network (CAN), or some combination of any or all of the above. In exemplary embodiments, the computing system can include one or more antennas 422 to facilitate wireless communication (e.g., via the network interface) between the computing device 400 and a network and/or between the computing device 400 and other computing devices. The network interface 408 may include a built-in network adapter, network interface card, PCMCIA network card, card bus network adapter, wireless network adapter, USB network adapter, modem or any other device suitable for interfacing the computing device 400 to any type of network capable of communication and performing the operations described herein.

The computing device 400 may run any operating system 410, such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, or any other operating system capable of running on the computing device 400 and performing the operations described herein. In exemplary embodiments, the operating system 410 may be run in native mode or emulated mode. In an exemplary embodiment, the operating system 410 may be run on one or more cloud machine instances.

Figure 5:
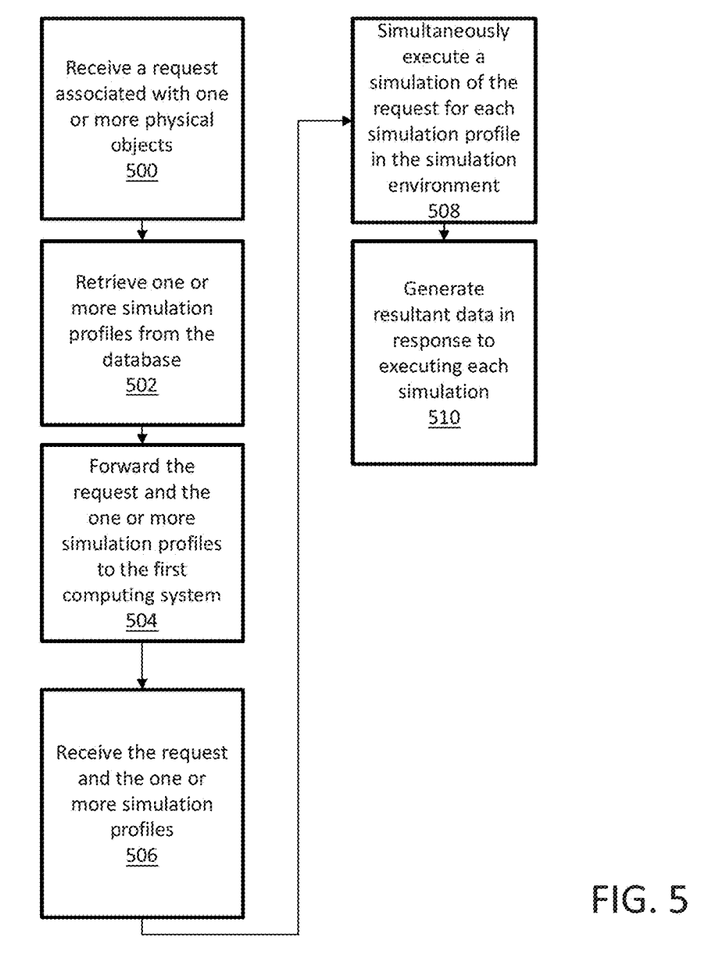
FIG. 5 is a flowchart illustrating a process implemented by the simulation system according to an exemplary embodiment.

FIG. 5 is a flowchart illustrating a process implemented by a simulation system according to an exemplary embodiment. In operation 500, a routing application (e.g. routing application 102 as shown in FIGS. 1 and 2) receives a request associated with one or more physical objects. The routing application is in communication with a first computing system (e.g. first computing system 200 as shown in FIG. 2) and a database (e.g. the profiles database 104). In operation 502, the routing application can retrieve one or more simulation profiles from the database. In operation 504, the routing application can forward the request and the one or more simulation profiles to the first computing system. In operation 506, the first computing system hosting a simulation environment (e.g. simulation environment 202 as shown in FIG. 2) can receive the request and the one or more simulation profiles.

In operation 508, the first computing system can simultaneously execute a simulation of the request for each simulation profile in the simulation environment. In operation 510, the first computing system can generate resultant simulation data in response to executing each simulation. In response to executing each simulation, the first computing system can retrieve, from the first database, a set of rules associated with each of the one or more simulation profiles, implement the set of rules while executing the simulation, and bypass a subsection of the simulation in response to implementing the set of rules.

Figure 6:
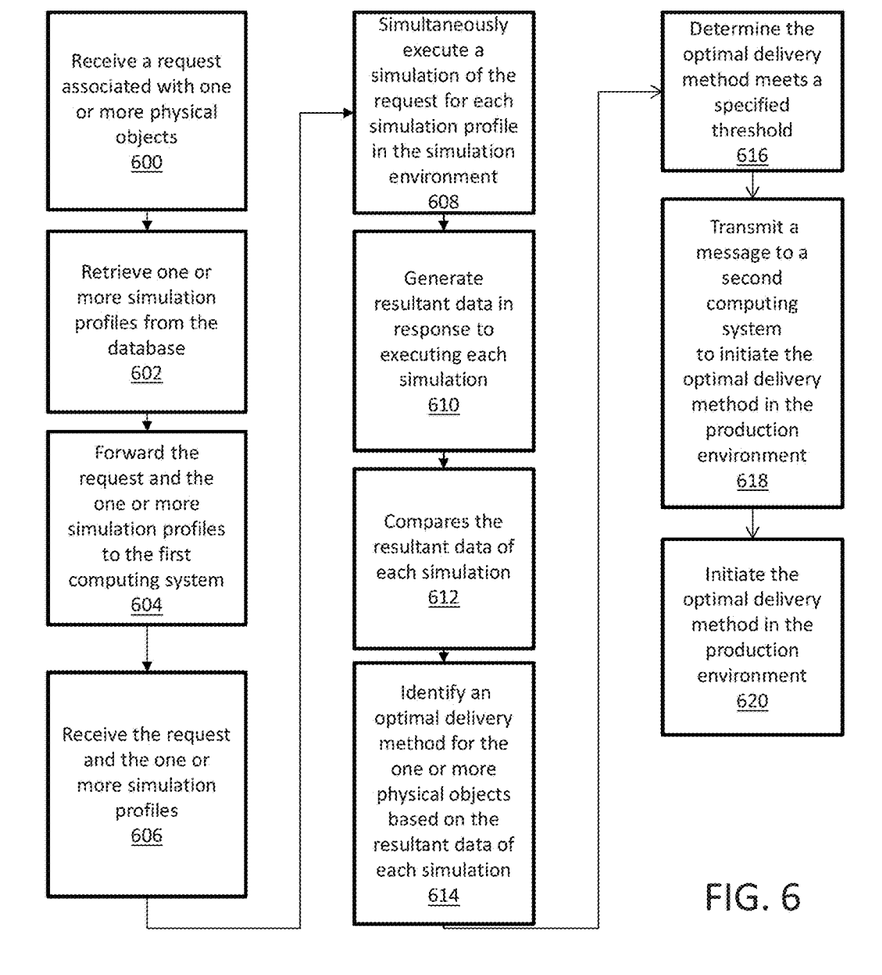
FIG. 6 is a flowchart illustrating a process implemented by the simulation system according to an exemplary embodiment.

FIG. 6 is a flowchart illustrating a process implemented by a simulation system according to an exemplary embodiment. In operation 600, a routing application (e.g. routing application 102 as shown in FIGS. 1 and 2) receives a request associated with one or more physical objects. The routing application is in communication with a first computing system (e.g. first computing system 200 as shown in FIG. 2) and a database (e.g. the profiles database 104). In operation 602, the routing application can retrieve one or more simulation profiles from the database. In operation 604, the routing application can forward the request and the one or more simulation profiles to the first computing system. In operation 606, the first computing system hosting a simulation environment (e.g. simulation environment 202 as shown in FIG. 2) can receive the request and the one or more simulation profiles.

In operation 608, the first computing system can simultaneously execute a simulation of the request for each simulation profile in the simulation environment. In operation 610, the first computing system can generate resultant data in response to executing each simulation. In operation 612, the first computing system compares the resultant data of each simulation. In operation 614 the first computing system identifies an optimal delivery method for the one or more physical objects based on the resultant data of each simulation. In operation 616, the first computing system determines that the optimal delivery method meets a specified threshold. In operation 618, the first computing system automatically transmits a message to a second computing system (e.g. second computing system 210 as shown in FIG. 2) hosting a production environment (e.g. production environment 212 as shown in FIG. 2) to initiate the optimal delivery method in the production environment. In operation 620, the second computing system initiates the optimal delivery method in the production environment.

In one embodiment execution of the production application generates resultant production data which may be evaluated with respect to key performance indicators. When the resultant simulation data is determined to represent an improved performance such as, but not limited to, an optimal delivery method, the system may, before altering the production application, compare the resultant simulation data to the resultant production data to determine which satisfies key performance indicators better. In the event that the resultant simulation data satisfies the key performance indicators better than the resultant production data, the production environment may alter the production application to substitute the rules of the simulation profile that generated the resultant simulation data in place of the original code used by the production application.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a multiple system elements, device components or method steps, those elements, components or steps may be replaced with a single element, component or step. Likewise, a single element, component or step may be replaced with multiple elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the present disclosure. Further still, other aspects, functions and advantages are also within the scope of the present disclosure.

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than the order shown in the illustrative flowcharts.

The invention claimed is:

1. A simulation system for a production environment, the system comprising:
   a first computing system hosting a simulation environment in communication with a first database;
   a second computing system hosting a production application;
   a routing application in communication with the first database and the first computing system, the routing application when executed:
      receiving a request for the delivery of one or more physical objects;
      retrieving from the first database one or more simulation profiles associated with the one or more physical objects, the simulation profiles each including a set of rules applicable to simulating the request;
      forwarding the request and the one or more simulation profiles to the first computing system;
   wherein the first computing system is configured to:
      receive the request and the one or more simulation profiles,
      execute a simulation of the request for each simulation profile of the one or more simulation profiles in the simulation environment, and
      generate resultant simulation data in response to executing each simulation, and
   wherein the second computing system is configured to:
      perform the request with the production application, the performance of the request generating resultant production data; and
      generate instructions for an order fulfillment system for the delivery of the one or more physical objects,
      wherein the resultant simulation data of each simulation and the resultant production data evaluated with respect to key performance indicators, and
   in the event that a particular resultant simulation data satisfies the key performance indicators better than the resultant production data, the production application is altered to substitute the rules of a simulation profile that generated the particular resultant simulation data in place of an original code used by the production application to generate the resultant production data.

2. The system of claim 1, further comprising:
   a web-based domain configured to transmit the request.

3. The system of claim 1, further comprising:
   a second database configured to store real-time data associated with the one or more physical objects.

4. The system of claim 3, wherein the first computing system is in communication with the second database and is configured to retrieve the real-time data associated with the one or more physical objects while executing each simulation.

5. The system of claim 1, wherein the request is associated with the delivery of the one or more physical objects.

6. The system of claim 5, wherein the first computing system is further configured to compare the resultant data of each simulation, identify an optimal delivery method for the one or more physical objects based on the resultant data of each simulation, determine the optimal delivery method meets specified requirements, and automatically transmit a message to the second computing system to initiate delivery of the one or more physical objects using the optimal delivery method.

7. The system of claim 1, wherein the sets of rules include one or more of constraints on fulfillment center capacity, carrier capacity, preferred fulfillment centers and order prioritization logic.

8. The system of claim 1, wherein the key performance indicators include one or more of new or alternate delivery options, a fulfillment center capacity, a fulfillment center labor and slots.

9. The system of claim 8, wherein the second computing system is configured to receive the message and initiate the optimal delivery method in the production environment.

10. The system of claim 1 wherein the simulation environment utilizes aspect oriented programming (AOP).

11. A method of simulation for a production environment, comprising:
    receiving, via a routing application in communication with a first database and a first computing system, a request for the delivery of one or more physical objects;
    retrieving, via the routing application, from the first database one or more simulation profiles associated with the one or more physical objects, the simulation profiles each including a set of rules applicable to simulating the request;
    forwarding, via the routing application, the request and the one or more simulation profiles to the first computing system;
    receiving, via the first computing system hosting a simulation environment and in communication with the first database, the request and the one or more simulation profiles;
    executing, via the first computing system, a simulation of the request for each simulation profile of the one or more simulation profiles in the simulation environment;
    generating, via the first computing system, resultant simulation data in response to executing each simulation;
    performing, via a second computing system hosting a production environment, the request with the production application, the performance of the request generating resultant production data;
    generating, via the second computing system, instructions for an order fulfillment system for the delivery of the one or more physical objects,
    wherein the resultant simulation data of each simulation and the resultant production data are evaluated with respect to key performance indicators, and
    in the event that a particular resultant simulation data satisfies the key performance indicators better than the resultant production data, the production application is altered to substitute the rules of a simulation profile that generated the particular resultant simulation data in place of an original code used by the production application to generate the resultant production data.

12. The method of claim 11, further comprising:
storing, via a second database configured to store real-time data associated with the one or more physical objects.

13. The method of claim 12, further comprising:
retrieving, via the first computing system in communication with the second database, the real-time data associated with the one or more physical objects while executing each simulation.

14. The method of claim 11, wherein the request is associated with the delivery of the one or more physical objects.

15. The method of claim 11, further comprising
comparing, via the first computing system, the resultant data of each simulation;
identifying, via the first computing system, an optimal delivery method for the one or more physical objects based on the resultant data of each simulation;
determining, via the first computing system, the optimal delivery method meets specified requirements; and
automatically transmitting, via the first computing system, a message to the second computing system to initiate delivery of the one or more physical objects using the optimal delivery method.

16. The method of claim 11, wherein the sets of rules include one or more of constraints on a fulfillment center capacity, a carrier capacity, a preferred fulfillment center and an order prioritization logic.

17. The method of claim 11, wherein the key performance indicators include one or more of new or alternate delivery options, fulfillment center capacity, fulfillment center labor and slots.

18. The method of claim 17, further comprising:
receiving, via the second computing system, the message and initiating the optimal delivery method in the production environment.

19. A non-transitory computer readable memory medium storing instructions for executing simulations for a production environment, wherein the instructions are executable by a processor to:
receive, via a routing application in communication with a first database and a first computing system, a request for the delivery of one or more physical objects;
retrieve, via the routing application, from the first database one or more simulation profiles associated with the one or more physical objects, the simulation profiles each including a set of rules applicable to simulating the request;
forward, via the routing application, the request and the one or more simulation profiles to the first computing system;
receive, via the first computing system hosting a simulation environment and in communication with the first database, the request and the one or more simulation profiles;
execute, via the first computing system, a simulation of the request for each simulation profile of the one or more simulation profiles in the simulation environment;
generate, via the first computing system, resultant simulation data in response to executing each simulation;
perform, via a second computing system hosting a production environment, the request with the production application, the performance of the request generating resultant production data;
generate, via the second computing system, instructions for an order fulfillment system for the delivery of the one or more physical objects,
wherein the resultant simulation data of each simulation and the resultant production data are evaluated with respect to key performance indicators, and
in the event that a particular resultant simulation data satisfies the key performance indicators better than the resultant production data, the production application is altered to substitute the rules of a simulation profile that generated the particular resultant simulation data in place of an original code used by the production application to generate the resultant production data.

20. The non-transitory computer readable memory medium of claim 19, wherein the instructions are executable by a processor to:
compare, via the first computing system, the resultant data of each simulation;
identify, via the first computing system, an optimal delivery method for the one or more physical objects based on the resultant data of each simulation;
determine, via the first computing system, the optimal delivery method meets specified requirements; and
automatically transmit, via the first computing system, a message to the second computing system to initiate delivery of the one or more physical objects using the optimal delivery method.

* * * * *